(12) United States Patent
Aono et al.

(10) Patent No.: US 6,841,421 B2
(45) Date of Patent: Jan. 11, 2005

(54) METHOD OF MANUFACTURING WIRING STRUCTURE OF A POWER SEMICONDUCTOR DEVICE

(75) Inventors: Tsutomu Aono, Tatebayashi (JP); Kikuo Okada, Kamisato-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 125 days.

(21) Appl. No.: 10/374,728

(22) Filed: Feb. 27, 2003

(65) Prior Publication Data

US 2003/0162330 A1 Aug. 28, 2003

(30) Foreign Application Priority Data

Feb. 27, 2002 (JP) ........................................ 2002-051994

(51) Int. Cl.[7] .............................................. H01L 21/44
(52) U.S. Cl. ....................... 438/121; 438/123; 257/784
(58) Field of Search ......................... 257/784; 438/121, 438/123

(56) References Cited

U.S. PATENT DOCUMENTS

| | | | | |
|---|---|---|---|---|
| 5,115,300 A | * | 5/1992 | Yanagida et al. ........... | 257/724 |
| 5,986,218 A | * | 11/1999 | Muto et al. ................. | 174/261 |
| 6,051,862 A | * | 4/2000 | Grimaldi et al. ............ | 257/341 |
| 6,055,148 A | * | 4/2000 | Grover ....................... | 361/103 |
| 6,198,160 B1 | * | 3/2001 | Yamaguchi ................. | 257/676 |

* cited by examiner

Primary Examiner—Richard Elms
Assistant Examiner—Christian D. Wilson
(74) Attorney, Agent, or Firm—Morrison & Foerster LLP (57) ABSTRACT

A semiconductor device includes a power supply semiconductor chip that has a plurality of current passing electrodes. Conductive plates are disposed on the current electrodes, and conductive wires used for an external connection of the device are fixed on the conductive plates, but not directly on the current passing electrode. A large plate is first fixed on the semiconductor chip, and then the back surface of the large plate is removed to form the individual conductive plates. Because the conductive wires are soldered onto the conductive plates, the semiconductor chip does not receive impact of wire bonding. Even when the conductive wires are wire bonded to the conductive plates, the plates may serve as shock absorbers during wire bonding procedure to reduce the impact of the wire bonding.

10 Claims, 9 Drawing Sheets

Prior Art

FIG.11

Prior Art

FIG.12

Prior Art

METHOD OF MANUFACTURING WIRING STRUCTURE OF A POWER SEMICONDUCTOR DEVICE

BACKGROUND OF THE INVENTION

1. Field of the Invention

The invention relates to semiconductor device that includes a semiconductor chip for power supply, specifically to a wiring structure of the device for external connection.

2. Description of the Related Art

Conventional power supply semiconductor devices are described, for example, in Japanese Laid-Open Patent Publication No. Hei 5-206449. As described in the publication, conventional power supply semiconductor devices relies on switching chips of standard size. To meet a specific current capacity requirement for an application of the device, the standard-size switching chips are connected in parallel to fabricate the power supply semiconductor device.

Figure 10:
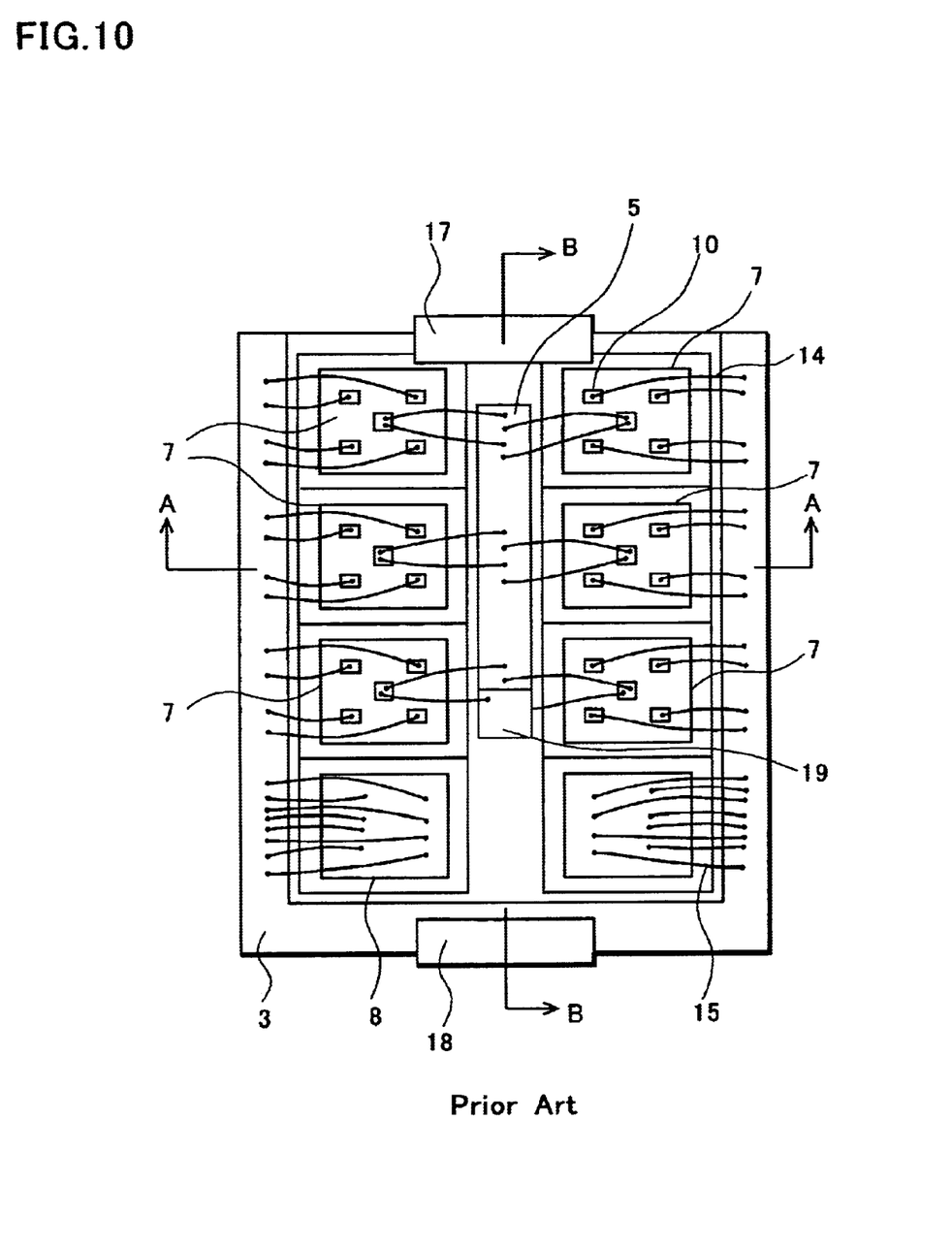
FIG. 10 is a plan view of a conventional semiconductor device.
Figure 11:
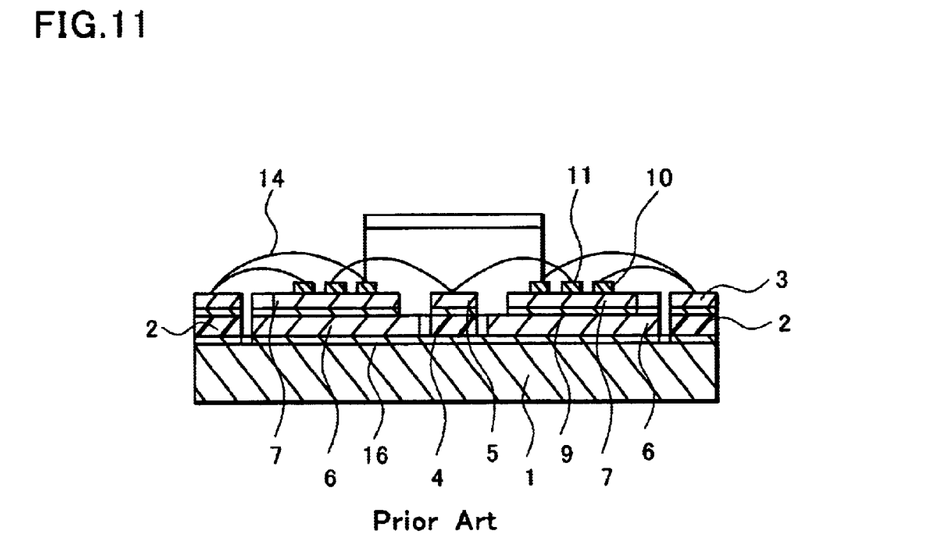
FIG. 11 is a cross-sectional view of the conventional semiconductor device of FIG. 10.
Figure 12:
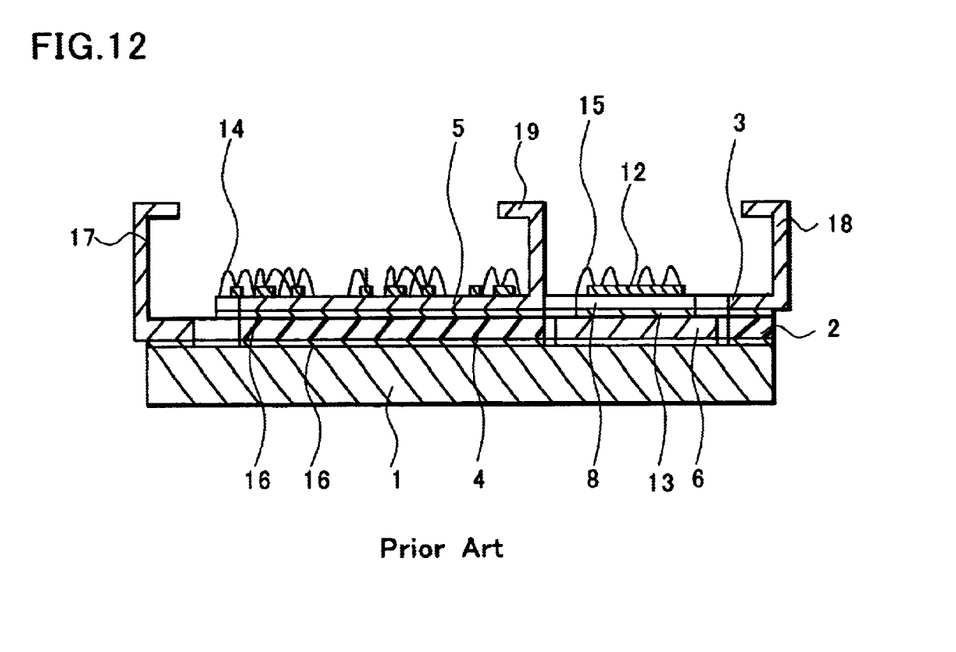
FIG. 12 is another cross-sectional view of the conventional semiconductor device of FIG. 10.

Now, referring to FIG. 10 through FIG. 12, an example of the configuration of the conventional power supply semiconductor device is briefly explained below. The description on the operation circuit of this semiconductor device is found in the aforementioned publication. FIG. 10 is a plan view of the semiconductor device. FIG. 11 is a cross-sectional view along line A—A of FIG. 10. FIG. 12 is a cross-sectional view along line B—B of FIG. 10.

A second electrode plate 3 is formed around the edge portions of a rectangular first electrode plate 1 made of copper, and is disposed on the first electrode plate 1 through an insulating plate 2 made of an insulating material such as alumina. A third electrode plate 5 is formed at the center of the first electrode plate 1. The third electrode plate 5 is disposed through an insulating plate 4 made of a material such as alumina, and formed in the shape of a stripe which is aligned parallel with two of the sides of the second electrode plate 3 formed on the first electrode plate. Furthermore, a buffer plate 6 is formed on the first electrode plate 1 away from the second electrode plate 3 and the third electrode plate 5 to surround the third electrode plate 5. The buffer plate 6 is made of a metal, such as molybdenum, having a thermal expansion coefficient that is approximately equal to that of a semiconductor.

Furthermore, three rectangular IGBT (Insulated Gate Bipolar Transistor) chips 7 are fixed on the buffer plate 6 in each of the two rows, as shown in FIG. 10. Two rectangular diode chips 8 are fixed near the corners of the buffer plate 6. The IGBT chip 7 has a pair of principal surfaces, with a collector electrode 9 provided on one principal surface, and emitter electrodes 10 and a gate electrode 11 provided on the other principal surface. The collector electrode 9 is disposed so as to face the buffer plate 6. On the other hand, the diode chip 8 has a pair of principal surfaces, with an anode electrode 12 provided on one principal surface and a cathode electrode 13 provided on the other principal surface. The cathode electrode 13 is disposed so as to face the buffer plate 6.

The emitter electrodes 10 on the IGBT chips 7 are electrically connected to the second electrode plate 3 with bonding wires 14. The gate electrode 111 on the IGBT chip 7 is connected to the third electrode plate 5 with the bonding wires 14. The anode electrode 12 on the diode chips 8 is connected to the second electrode plate 3 with bonding wires 15. The semiconductor device further includes an adhesive layer 16 formed of a material such as solder, a first lead terminal 17, a second lead terminal 18, and a third lead terminal 19. These lead terminals may be integrated with the electrode plates, or they may be separately provided to combine with the corresponding electrode plates.

As described above, the conventional power supply semiconductor device is configured such that the emitter electrodes 10 on the IGBT chips 7 are connected to the second electrode plate 3 with bonding wires 14. Because many emitter electrodes 10 are formed on the IGBT chips 7, the bonding wire 14 must be connected to each of the emitter electrodes 10. Likewise, a multiple wire bonding must be performed for each of the anode electrodes 12. It should be note that the semiconductor device can provide various functions by changing the number of IGBT chips 7 and diode chips 8 that it uses.

In this configuration, to supply uniform current to the emitter region, the number of the bonding wires 14 must be the same as that of the emitter electrodes 10. Accordingly, boding must be repeated the number of times equal to the number of the bonding wires 14. For this reason, the wire bonding process needs a long process period, thus making this process inefficient.

Furthermore, to connect a plurality of emitter electrodes 10 on the IGBT chips 7 to the second electrode plate 3 with the bonding wires 14, wire bonding with heat and pressure or with ultrasonic wave must be performed. During such a bonding procedure, vibrations inevitably occur at the IGBT chips 7, thereby asserting mechanical stresses on the chips 7. As a result, repeating the bonding procedure multiple times on the same chip induces crack formation in interlayer insulating films made of a material such as silicon oxide.

SUMMARY OF THE INVENTION

The invention provides a method of manufacturing a semiconductor device. The method includes providing a semiconductor chip having a plurality of current passing electrodes and a plurality of control electrodes. The current passing electrodes and the control electrodes are disposed on a primary surface of the semiconductor chip. The method also includes providing a conductive plate having a first surface on which a plurality of projecting portions are formed and a second surface. The first and second surfaces define two primary surfaces of the conductive plate. The method further includes fixing the conductive plate on the semiconductor chip so that the first surface of the conductive plate faces the primary surface of the semiconductor chip. In this configuration, the current passing electrode and the control electrodes each face the corresponding projecting portions. The method also includes etching the conductive plate fixed on the semiconductor chip from the second surface of the conductive plate so that the projecting portions are separated from each other, and connecting a conductive wire to each of the separated projecting portions.

DETAILED DESCRIPTION OF THE INVENTION

Now, the invention will be described in detail with reference to FIG. 1 through FIG. 9.

Figure 1:
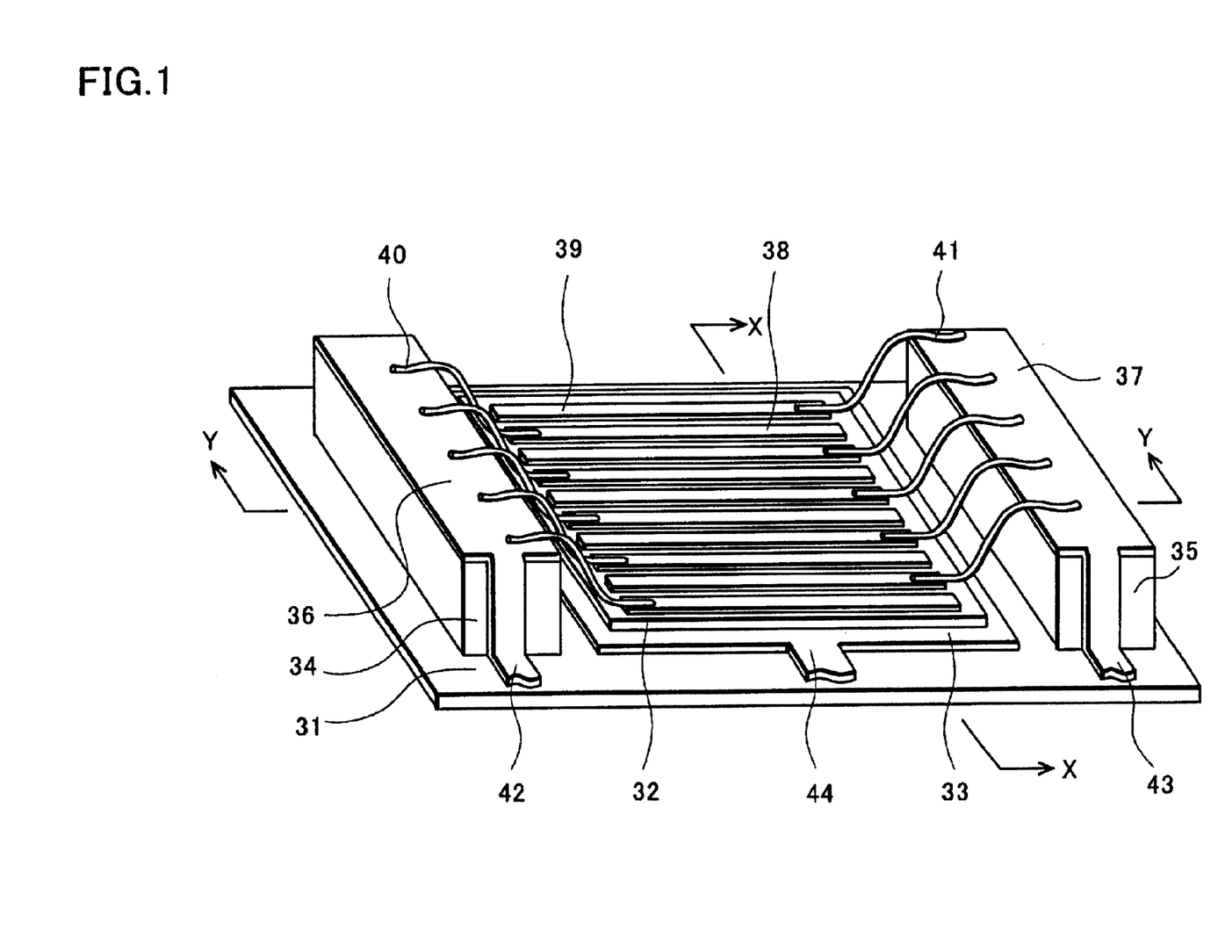
FIG. 1 is a perspective view of a semiconductor device according to an embodiment of the invention.
Figure 2:
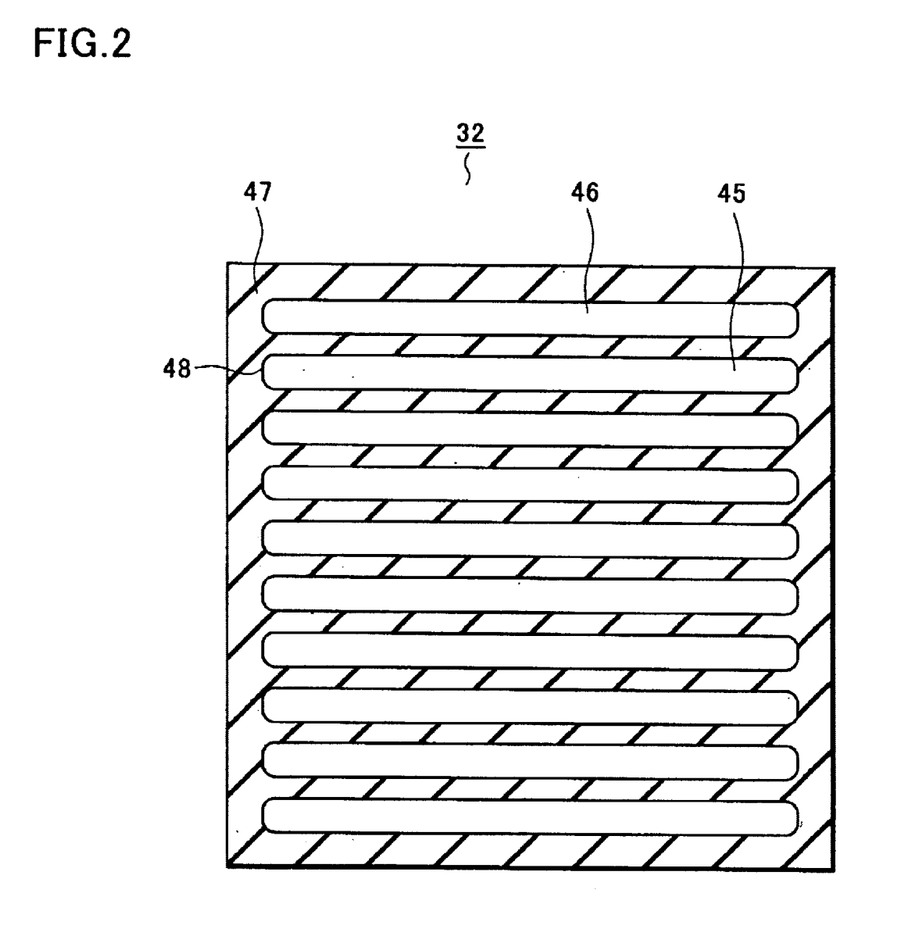
FIG. 2 is a plan view of a semiconductor chip for use with the semiconductor device of the embodiment.
Figure 3:
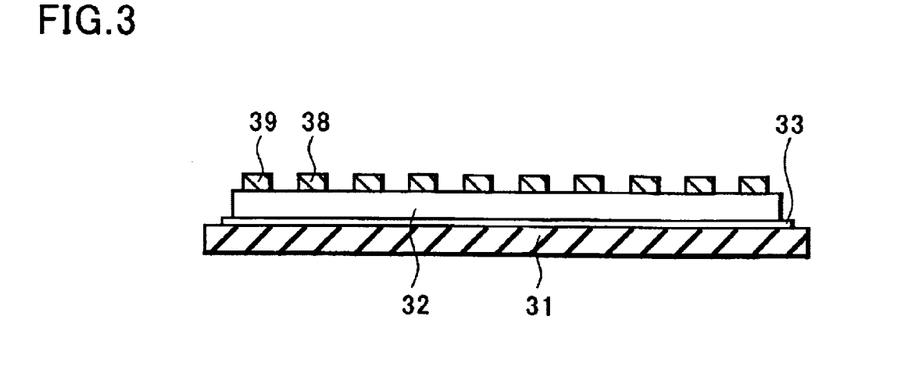
FIG. 3 is a cross-sectional view of the semiconductor device of FIG. 1 along line X—X of FIG. 1.
Figure 4:
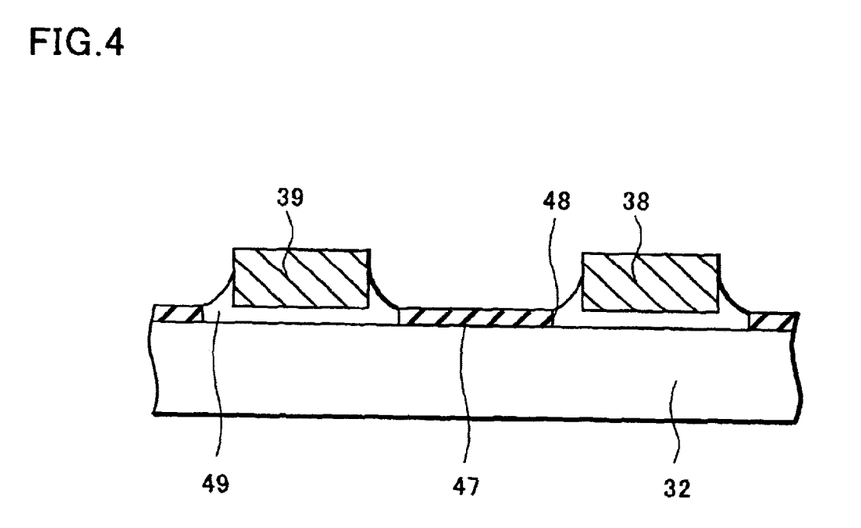
FIG. 4 is a partial expanded view of the cross-sectional view of FIG. 3.
Figure 5:
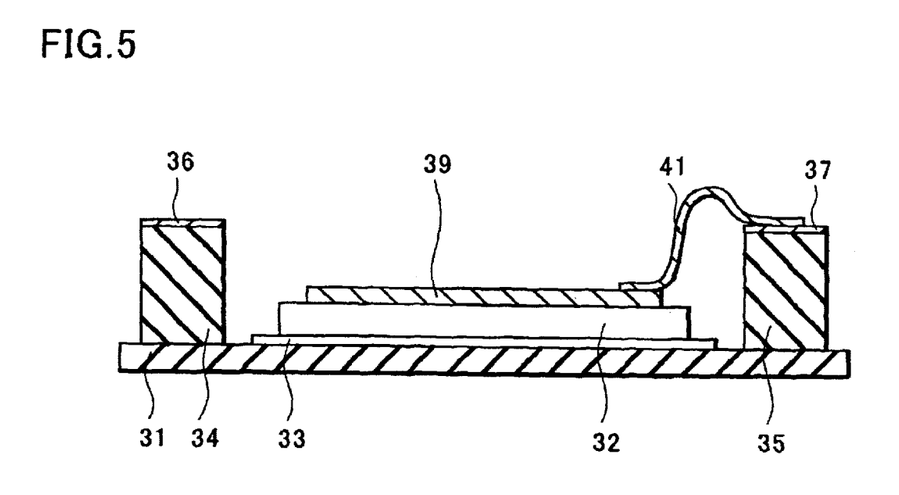
FIG. 5 is a cross-sectional view of the semiconductor device of FIG. 1 along line Y—Y of FIG. 1.
Figure 6:
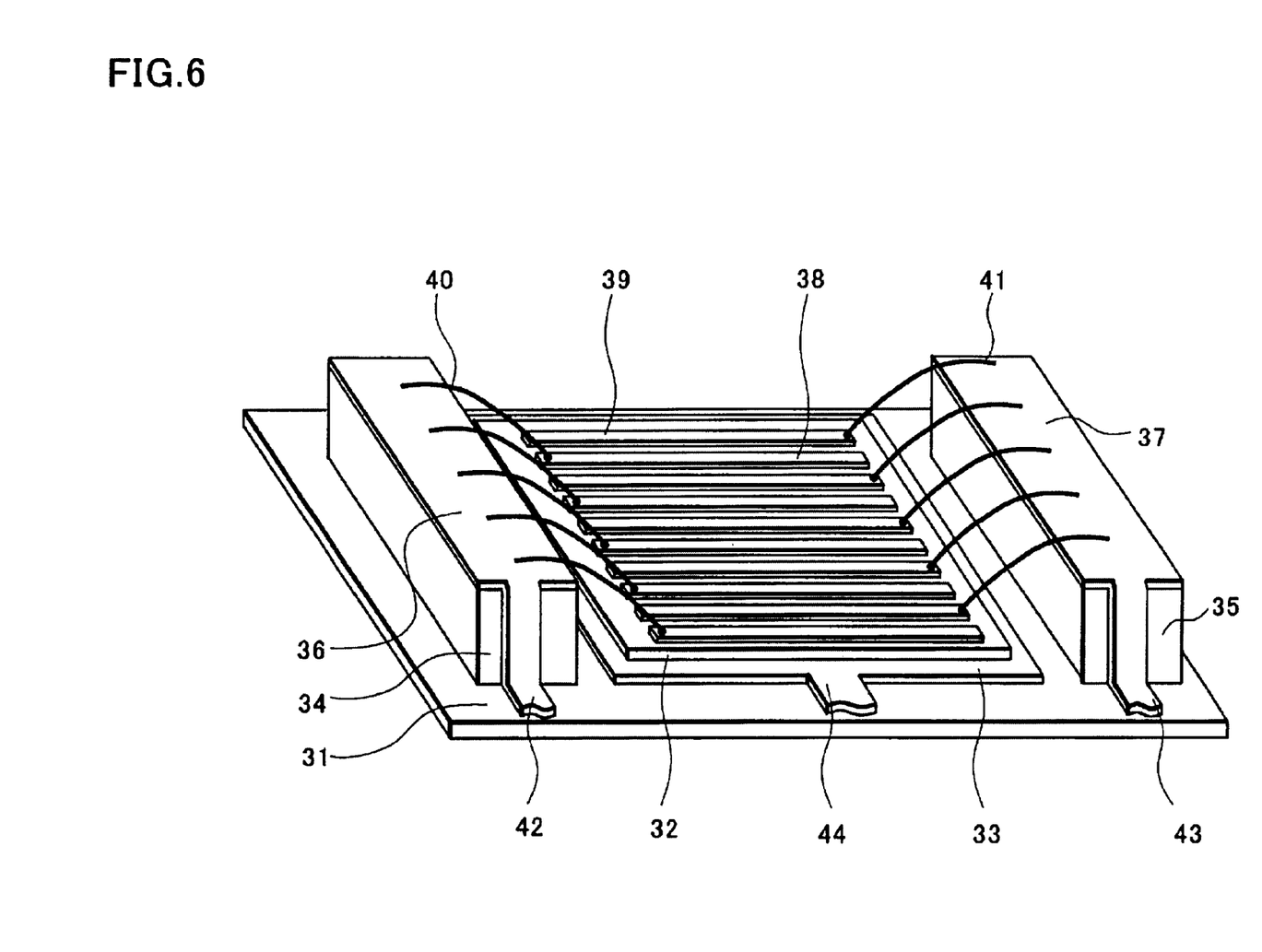
FIG. 6 is a perspective view of a semiconductor device according of a modified embodiment.

An embodiment of the invention employs an IGBT chip which has two different types of electrodes alternately formed on a principal surface of the chip. This embodiment also applies to a GTBT (Grounded-Trench-MOS assisted Bipolar-mode FET) chip. FIGS. 1 and 6 show two basic structures of the semiconductor device of this embodiment. FIG. 2 is a plan view illustrating a surface of the semiconductor chip of the semiconductor device shown in FIG. 1. FIG. 3 is a cross-sectional view along line X—X shown in FIG. 1. FIG. 4 is a cross-sectional view illustrating an electrically conductive plate fixed on an electrode. FIG. 5 is a cross-sectional view along line Y—Y shown in FIG. 1.

As shown in FIG. 1, the semiconductor device of this embodiment mainly includes an insulating substrate 31, a securing region 33 that is made of an electrically conductive foil to contact a collector electrode and is provided on the insulating substrate 31 to secure the IGBT chip 32, a pair of seats 34, 35 that is made of an insulating material and is formed on both sides of the securing region 33, connection regions 36, 37 that are made of an electrically conductive foil and are formed on the seats 34, 35 for connection to emitter electrodes 45 and gate electrodes 46, electrically conductive plates 38 fixed on the emitter electrodes 45 and electrically conductive plates 39 fixed on the gate electrode 46, conductive wires 40, 41 electrically connecting the electrically conductive plates 38, 39 to the connection regions 36, 37, and an emitter terminal 42 and a control terminal each for connecting this device to an external device. The emitter electrode and the collector electrode serve as current passing electrodes, and the gate electrode serves as a control electrode because the electric current between the emitter and collector electrodes is controlled by the signal received by the gate electrode.

Now, each component that makes up the semiconductor device of this embodiment is described below.

First, the substrate 31 is described. In this embodiment, the power supply semiconductor chip 32, which is the IGBT chip, of a current density of 300 A/cm$^2$ is mounted on the substrate 31. Because of the large heat generation by the semiconductor chip 32, a ceramic substrate is employed which has a good heat dissipation capability. Other materials that may be used as the substrate 31 include metal substrates with insulated top surface, such as a Cu substrate, an Fe substrate, and an alloy such as an Fe—Ni substrate, and an AlN (aluminum nitride) substrate. It is also possible to attach a ceramic substrate on the metal substrate.

The seats 34, 35 placed on the substrate 31 require machinability, heat dissipation, and thus is formed of a ceramic. The seats 34, 35 are disposed on both sides of the semiconductor chip 32 opposite to each other, with the surface of the seats 34, 35 being located higher than that of the semiconductor chip 32. The structure is configured to prevent the conductive wires 40, 41 from being short-circuited on the edges of the semiconductor chip 32. In this embodiment, the connection region 36 is a copper foil that is formed on the seat 34 and extends to the emitter terminal 42. Thus, the emitter electrode 45 is connected to an external device through the conductive plate 38, the conductive wire 40, the connection region 36 and the emitter terminal 42. Similarly, the connection region 37 is formed on the seat 35 for the external connection of the gate electrode 46.

Additionally, the emitter terminal 42 is formed as one unit combined with the connection region 36. Likewise, the gate terminal 43 is formed as one unit combined with the connection region 37.

The conductive wires 40, 41 extending from the surface of the semiconductor chip 32 may also be directly connected to a conductive portion of another device external to the power supply semiconductor device. In this case, the seats 34, 35, the connection regions 36, 37, and the terminals 42, 43 may be eliminated. Only the seats 34, 35 may also be eliminated when the connection regions 36, 37 are formed directly on the insulating substrate 31. Furthermore, the semiconductor chip 32 does not have to be mounted on the insulating substrate 31, but may be mounted on a lead frame, a printed circuit board or the like to implement the wiring structure of this embodiment.

The structure of the primary surface of the semiconductor chip 32 prior to receiving the conductive plates is described below with reference to FIG. 2. There is formed an insulating layer 47 on the surface of the semiconductor chip 32, and the emitter electrodes 45 and gate electrodes 46 are exposed through holes 48 provided in the insulating layer 47. Here, the holes 48 provided in the insulating layer 47 each have an opening that extends horizontally on the surface of the semiconductor chip to form parallel lines. The holes 48 are substantially parallel in the thickness direction of the insulating layer as well. The emitter electrodes 45 and the gate electrodes 46 are exposed alternately from the corresponding holes 48. A silicon oxide film (not shown) is formed as an interlayer insulating film below the emitter electrode 45 and the gate electrode 46.

As shown in FIG. 3, the semiconductor device of this embodiment includes the feature that electrically conductive plates 38, 39, made of Cu or a Cu alloy are fixed with solder 49 (see FIG. 4) on the emitter electrodes 45 and the gate electrodes 46 exposed from the insulating layer 47 on the primary surface of the semiconductor chip 32. Each of the emitter electrodes 45 and the gate electrodes 46 receives one conductive plate.

Specifically, as shown in FIG. 1, the electrically conductive plates 38, 39 are large enough to substantially cover all of the individual emitter electrodes 45 and the gate electrodes 46 which are exposed from the holes 48, and yet small enough to be accommodated within the holes 48. The electrically conductive plates 38, 39 are fixed through the solder 49 on the emitter electrodes 45 and the gate electrodes 46 which are exposed from the holes 48 provided in the insulating layer 47 on the surface of the semiconductor chip 32. Here, the insulating layer 47 is made of a material having no solder wettability. Thus, the surface tension of the solder which is used to fix the conductive plates 36, 37 on the electrodes 45, 46 aligns the conductive plates with the corresponding electrodes within the corresponding holes without any application of external force. Furthermore, because of the sizes of the electrically conductive plates and the exposed electrodes as describe above, the electrically conductive plates 38, 39 are reliably fixed on the electrodes 45, 46 with the solder over their substantially entire contact regions with the electrodes. Accordingly, in this embodiment, on the surface of the semiconductor chip 32, the electrically conductive plates 38, 39 are disposed in ten lines that are substantially parallel to each other with an equal interval.

Consequently, any two conductive plates next to each other are positioned parallel because of the self-alignment due to the surface tension of the solder. This leads to prevention of short circuits by eliminating probable contacts between the conductive plates. Furthermore, the soldering procedure of the conductive plates on the electrodes is effective and easy because of the self-alignment.

It is also possible to change the width and the thickness of the electrically conductive plates 38, 39 depending on the semiconductor chip 32 to be used or the current capacity required in an application.

Now, as shown in FIG. 1 and FIG. 6, the semiconductor device of this embodiment has the feature that the electrically conductive plates 38, 39 fixed on the surface of the semiconductor chip 32 are electrically connected to the connection regions 36, 37 through the conductive wires 40, 41. There are two methods available for connecting the conductive wires as described below. Structures implemented by these methods are now explained. FIG. 6 is a perspective view illustrating the basic structure of another semiconductor device of this embodiment.

A first structure of this embodiment employs a copper (Cu) wire as the conductive wires 40, 41. This structure is characterized in that the electrically conductive plates 38, 39 are connected to the connection regions 36, 37 with the conductive wires 40, 41 using solder. That is, such a structure is realized in which no wire bonding is employed on the surface of the semiconductor chip 32. As shown in FIG. 1, in the first structure, the electrically conductive plates 38, 39 are connected to the connection regions 36, 37 with the conductive wires 40, 41 using solder. One end of the conductive wires 40, 41 is connected to the electrically conductive plates 38, 39 at their end portions. Here, the end portion of the electrically conductive plate refers to a region on the surface of the electrically conductive plate at one end of the conductive plate. The conductive wires 40, 41 may also be fixed to the electrically conductive plates 38, 39 at any position. To improve the electrical and mechanical contact between the conductive wires 40, 41 and the electrically conductive plates 38, 39, the contact portions of the conductive wires 40, 41 and the contact portions of the electrically conductive plates 38, 39 are plated in advance, for example, with solder, Au, Ag, or Pd. It is also possible to plate the entire portions of the conductive wires 40, 41 and the electrically conductive plates 38, 39. With the structure of this embodiment, no wire is bonded on the surface of the semiconductor chip 32, thus generating no impact to the semiconductor chip 32 due to the wire bonding procedure. Consequently, no cracks occur in the interlayer insulating film formed at the lower regions of the electrodes 45, 46 of the semiconductor chip 32, thereby making it possible to provide a quality semiconductor device of high reliability.

Furthermore, as described above, the semiconductor device of this embodiment is configured such that the conductive wires 40, 41 are connected to the electrically conductive plates 38, 39 at their end portions. Additionally, as described above, the electrically conductive plates 38, 39 are fixed on the exposed electrodes 45, 46 with solder substantially covering the entire contact areas. This makes it possible to provide uniform current to the electrodes 45, 46 that are exposed on the surface of the semiconductor chip 32 through the insulating layer 47.

Furthermore, as described above, in the semiconductor device according to this embodiment, the electrically conductive plates 38, 39 are connected to the connection regions 36, 37 with conductive wires 40, 41, respectively. This provides tolerance for some errors in the size and positioning of the connection regions 36, 37 and the semiconductor chip 32 because the conductive wires 40, 41, the bonding wires, have elasticity and ductility. As a result, for example, this structure allows the seats 34, 35 to have a large height tolerance, thereby providing improved workability and mass-productivity in the manufacturing of the semiconductor device.

Furthermore, in this configuration, a half of the conductive wires is connected to the conductive regions on one side of the semiconductor chip, and another half of the conductive wires is connected to the connection region on another side of the semiconductor chip. This prevents the conductive wires 40, 41 from heavily populating the wire connection area, thereby providing a simplified structure to the semiconductor device.

A second structure is described with reference to FIG. 6 in which a gold (Au) and an aluminum (Al) wire are used as the conductive wires 40, 41. This structure is characterized in that the electrically conductive plates 38, 39 are connected to the connection regions 36, 37 by bonding wires. More specifically, the conductive wires 40, 41, the bonding wires in this structure of the embodiment, are bonded at the end portions of the electrically conductive plates 38, 39. In this structure, as described above, since the electrically conductive plates 38, 39 are reliably secured using solder, each impact caused by the wire bonding can be scattered over the entire plate. Therefore, according to this embodiment, the surface of the semiconductor chip 32 is not directly bonded with wires, and the electrically conductive plates 38, 39 may also serve as a buffer plate. As a result, the wire bonding procedure generates significantly reduced impact to the semiconductor chip 32. This in turn makes it possible to prevent the interlayer insulating film formed below the emitter electrode 45 and the gate electrode 46 from being cracked due to an impact caused by the wire bonding. This embodiment employs a structure in which the conductive wires 40, 41 are connected to the electrically conductive plates 38, 39 at the end portions thereof. However, it is not necessarily limited to this configuration. The same effects as described above can also be provided even when the conductive wires 40, 41 are connected to the electrically conductive plates 38, 39 at any given position. Here, the end portion of the electrically conductive plate refers to the same region of the conductive plate as in the first structure.

Other effects such as those obtained by elasticity and ductility of the conductive wires 40, 41 can be provided in the same manner as in the first structure.

Finally, the securing region 33 made of a copper foil is formed on the substrate 31. As described above, on the back side of the semiconductor chip 32, formed is a collector electrode (not shown), which is electrically connected to the securing region 33 using solder. A collector terminal 44 is formed as one unit combined with the securing region 33.

The securing region 33 is thus connected to an external lead through the collector terminal 44.

Now, a method for manufacturing the semiconductor device of this embodiment is described with reference to FIG. 7 through FIG. 9. The same reference numerals as in the FIGS. 1-6 are used to indicate the same corresponding components in FIGS. 7-9.

Figure 7:
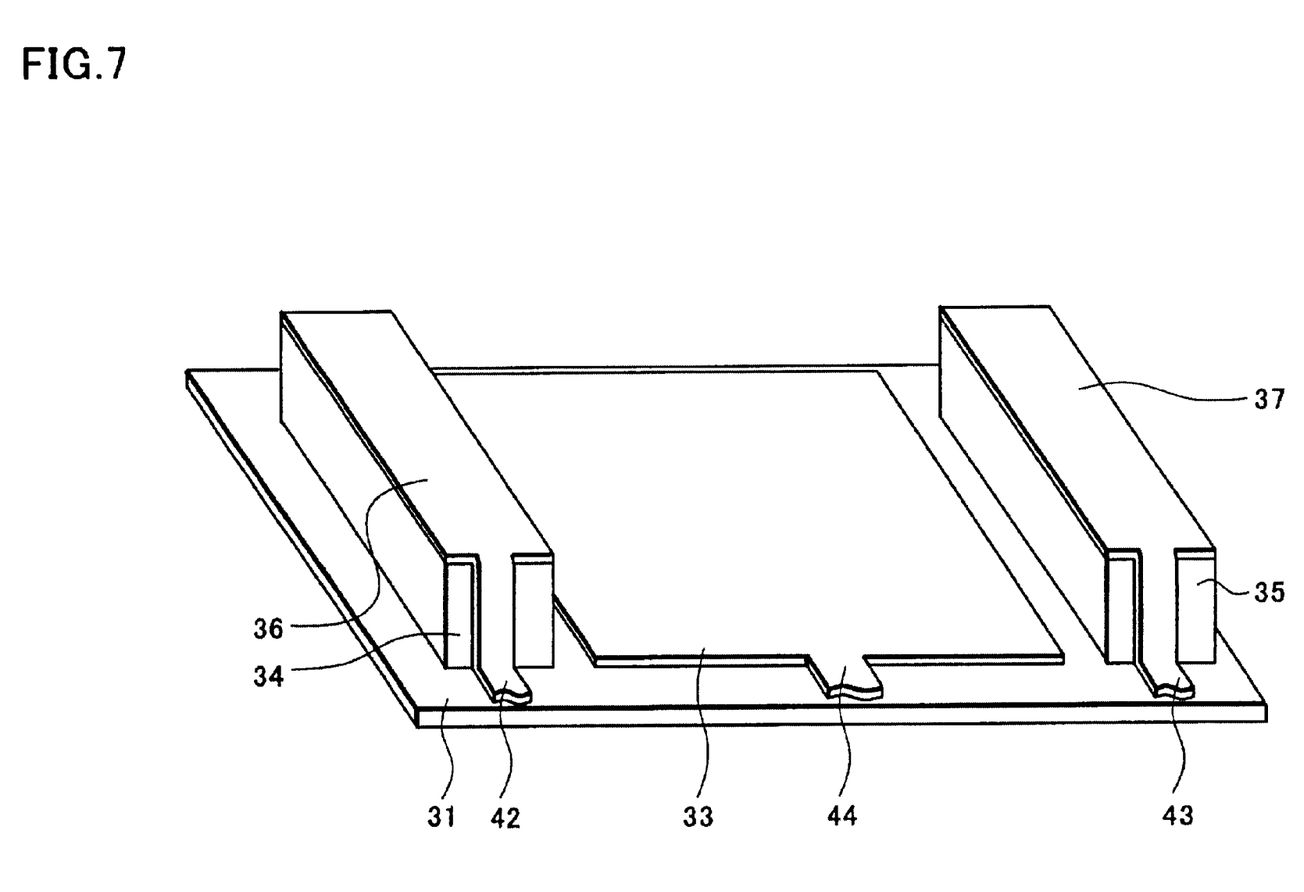
FIG. 7 is a perspective view of a base structure for mounting the semiconductor chip of the embodiment.

As shown in FIG. 7, the first step to fabricate the device is to provide a base structure for mounting the semiconductor chip 32.

In this step, first, the substrate 31 is provided. The power supply semiconductor chip 32, such as an IGBT chip, having a current density of about 300 A/cm$^2$ is mounted on the substrate 31. Other materials that may be used as the substrate 31 include metal substrates with insulated top surface, such as a Cu substrate, an Fe substrate, and an alloy such as an Fe—Ni substrate, and an AlN (aluminum nitride) substrate. It is also possible to attach a ceramic substrate on the metal substrate.

Then, an electrically conductive foil is pressed onto the central portion of the substrate 31 to form the securing region 33. The size of the securing region 33 depends on the size of the semiconductor chip 33 that it carries thereon. The collector terminal 44 is also formed at this step as an extension of the securing region 33.

The materials for the conductive foil are selected based on adhesion to the solder, which is used to mount the semiconductor chip 33 later in the manufacturing process, and ease of wire bonding. In this embodiment, a Cu-based foil is used. Other appropriate materials are a Al-based foil, a Fe—Ni alloy and the like.

Subsequently, a pair of seats 34, 35 is placed on both sides of the securing region 33 on the substrate 31. The seats 34, 35 are formed of a ceramic in consideration of their machinability, heat dissipation and the like. A copper foil is also attached on the top surface of each of the seats 34, 35 to form the connection regions 36, 27. The emitter terminal 42 and the gate terminal 43 are formed at the same process step as the terminal as their extensions.

The device structure of this embodiment may include those without the seats 34, 35, as described above. The manufacturing process of such a device does not include the formation of the seats and the connection regions. Furthermore, the ceramic substrate may be replaced by a lead frame, a printed circuit board or the like.

Figure 8A:
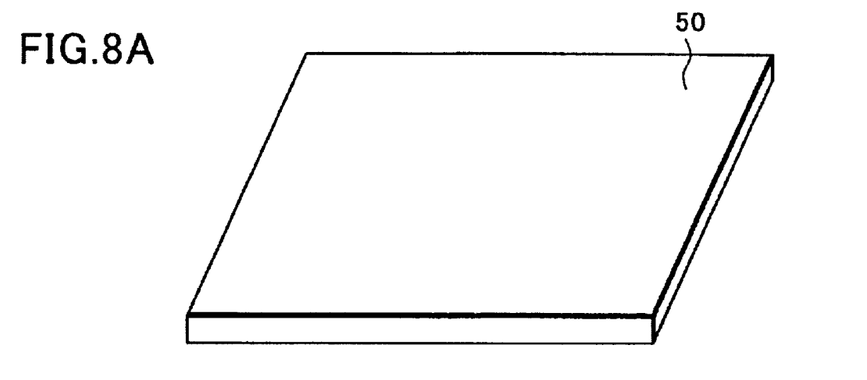
FIGS. 8A–8C show steps for manufacturing a conductive plate precursor of the embodiment.
Figure 8B:
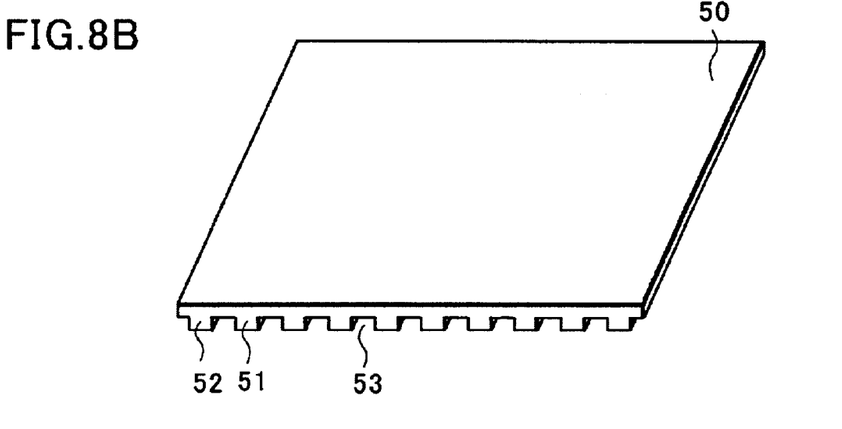
Figure 8C:
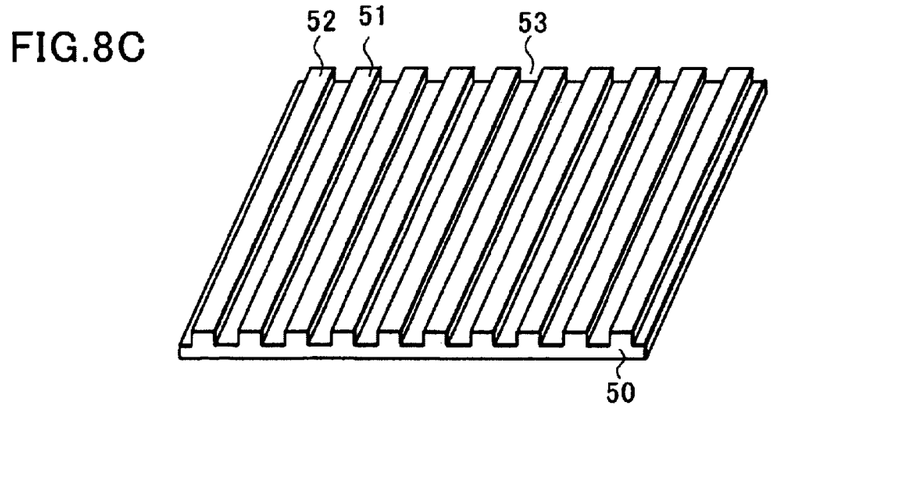

A precursor plate for forming the conductive plates is prepared in the next step as shown in FIGS. 8A-8C.

In this step, as shown in FIG. 8A, first, a sheet of a precursor plate 50 is provided. The precursor plate 50 needs to be large enough to cover substantially the entire electrode exposed on the surface of the semiconductor chip 32. In this embodiment, the precursor plate 50 is made of a Cu or Cu alloy and varies approximately 100 µm to 500 µm in its thickness. The thickness is determined in accordance with the current capacity of the semiconductor chip.

Now, as shown in FIG. 8B, ten rows of projecting portions 51, 52 are formed in the plates. First, a photoresist (an etching resistant mask) is formed on the precursor plate 50. Then, the photoresist is patterned such that the plate 50 is exposed excluding the regions that will serve as the projecting portions 51, 52 corresponding to the emitter electrodes 45 and the gate electrodes 46. Thereafter, the precursor plate 50 is etched through the photoresist.

In this step, to form separation grooves 53 of uniform and accurate depth by etching, an etchant is sprayed upwardly from an etchant supply tube located under the precursor plate 50, with the patterned resist surface facing down. As a result, the portions of the separation groove 53 are etched, and the etchant does not stay within the separation groove 53 but immediately discharges from the separation groove 53. This allows the depth of the separation groove 53 to be controlled in accordance with the duration of the etching, thereby making it possible to form the separation groove 53 uniformly and accurately. As the etchant, ferric chloride or cupric chloride is frequently employed. The projecting portions 51, 52 of the plate 50 may be selectively plated in advance, thereby making it possible to provide improved solder wettability in the subsequent mounting process.

Then, as shown in FIG. 8C, the precursor plate is completed, which has five projecting portions 51 corresponding to the emitter electrode 43, and five projecting portions 52 corresponding to the gate electrode 46. The two set of the projecting portions are interposed to each other.

Figure 9A:
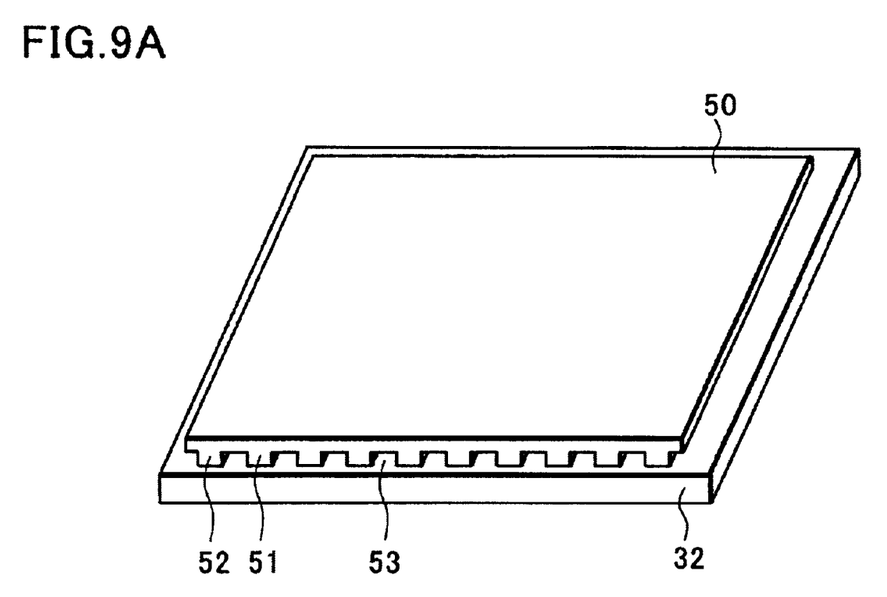
FIGS. 9A and 9B show steps for forming conductive plates on the surface of the semiconductor chip of the embodiment.
Figure 9B:
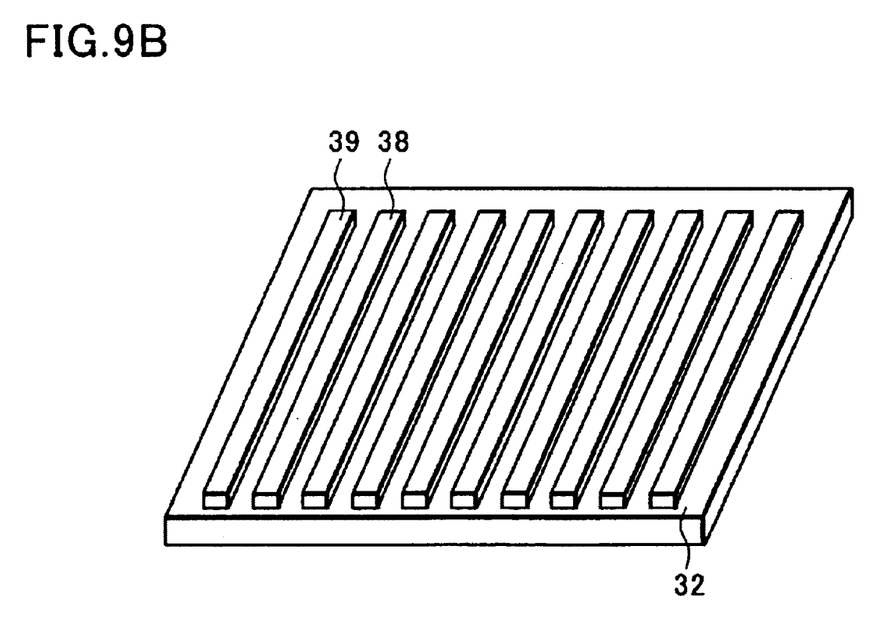

Then, in the next step, the precursor plate 50 is fixed on the semiconductor chip 32 as shown in FIG. 9A, and the unetched back surface of the precursor plate is removed as shown in FIG. 9B.

As shown in FIG. 9A, in this step, the projecting portions 51, 52 of the precursor plate 50 are positioned and fixed onto the emitter electrodes 45 and the gate electrodes 46 on the surface of the semiconductor chip 32 using a solder as an adhesive. To fix the precursor plate 50 on the semiconductor chip 32, the projecting portions 51, 52 may be plated with solder in advance. Conversely, the emitter electrodes 45 and the gate electrodes 46 on the surface of the semiconductor chip 32 may be plated with solder, prior to the fixation of the precursor plate 50. The self-alignment due to the surface tension of the solder places the plate 50 accurately into the holes of the insulating layer on the surface of the semiconductor chip 32. As a result, the projecting portions 51, 52 of the plate 50 are fixed on the emitter electrodes 45 and the gate electrodes 46 with good positional accuracy.

The precursor plate 50 fixed on the surface of the semiconductor chip 32 is then separated into individual electrically conductive plates 38, 39, respectively corresponding to the emitter electrodes 45 and the gate electrodes 46, as shown in FIG. 9B. The unetched back surface of the precursor plate 50 is then removed chemically and/or physically to form the individual electrically conductive plates 38, 39. This step is carried out through polishing, grinding, etching, metal evaporation with laser beams or the like.

This results in the formation of the electrically conductive plates 38, 39 for each of the emitter electrodes 45 and the gate electrodes 46. Because the depth of the separation groove 53 of the precursor plate 50 is controlled by the duration of etching uniformly and accurately, the separated electrically conductive plates 38, 39 on the surface of the semiconductor chip 32 are uniform in thickness and fixed on the corresponding emitter electrodes 45 and the gate electrodes 46 with good positional accuracy.

Although the individual electrically conductive plates 38, 39 are minute in size, they are handled as one large plate 50 during the fixation on the semiconductor chip 32. In addition to the accurate and easy initial positioning of the precursor plate 50 on the semiconductor chip surface, the self-alignment further improves the accuracy of the positioning. As a result, it is possible to improve the workability of this processing step and mass productivity of the semiconductor device.

Now, in the next step, as shown in FIG. 1, the semiconductor chip 32 with the electrically conductive plates 38, 39 is fixed on the securing region 33. Then, the electrically conductive plates 38, 39 are connected to the connection regions 36, 37 with the conductive wires 40, 41. As described above, there are two methods available for connecting the conductive wires 40, 41.

A first method is described below. In this step, as shown in FIG. 1, the electrically conductive plates 38, 39 are electrically connected to the connection regions 36, 37 with the conductive wires 40, 41 using solder. A copper (Cu) wire is used as the conductive wires 40, 41. The conductive wires 40, 41 are connected the electrically conductive plates 38, 39 and the connection regions 36, 37 using a solder as an adhesive. To improve the adhesion between the conductive wires 40, 41 and the electrically conductive plates 38, 39, the contact regions of the conductive wires 40, 41 and the contact regions of the electrically conductive plates 38, 39 are plated in advance with a solder, Au, Ag, or palladium (Pd). Thereafter, the conductive wires 40, 41 and the electrically conductive plates 38, 39 are connected with the solder at desired positions. It is also possible to plate the entire portion of the conductive wires 40, 41 and the electrically conductive plates 38, 39.

Additionally, as illustrated in FIG. 2, the conductive wires 40, 41 and the electrically conductive plates 38, 39 are connected at the end portions of the electrically conductive plates 38, 39, but may not be limited thereto. It is possible to provide the connection at any position on the electrically conductive plates 38, 39. At the end of this step, the semiconductor device shown in FIG. 1 is completed.

In this manufacturing method, no wire bonding is carried out on the surface of the semiconductor chip 32. Since no wire bonding is carried out on the surface of the semiconductor chip 32, no impact of the wire bonding is imposed on the semiconductor chip 32. As a result, no cracks occur in the interlayer insulating film formed at the lower portion region of the electrodes 45, 46 of the semiconductor chip 32, thereby making it possible to provide a quality semiconductor device of high reliability.

Furthermore, as described above, the flexibility and ductility of the conductive wires allow for a large size tolerance of the components of this device.

In a second manufacturing method, the electrically conductive plates 38, 39 are connected to the connection regions 36, 37 with the conductive wires 40, 41 by wire bonding, as shown in FIG. 6. In this step, a gold (Au) or an aluminum (Al) wire is used as the conductive wires 40, 41. As described above, because of the electrically conductive plates 38, 39, each impact caused by the wire bonding is scattered over the entire plate. As a result, it is possible to reduce the impact of each wire bonding on the semiconductor chip 32. This leads to the prevention of the crack formation in the interlayer insulating film.

The above is a detailed description of particular embodiments of the invention which is not intended to limit the invention to the embodiments described. It is recognized that modifications within the scope of the invention will occur to persons skilled in the art. Such modifications and equivalents of the invention are included within the scope of this invention.

What is claimed is:

1. A method of manufacturing a semiconductor device, comprising:

providing a semiconductor chip comprising a plurality of current passing electrodes and a plurality of control electrodes, the current passing electrodes and the control electrodes being disposed on a primary surface of the semiconductor chip;

providing a conductive plate comprising a first surface on which a plurality of projecting portions are formed and a second surface, the first and second surfaces defining two primary surfaces of the conductive plate;

fixing the conductive plate on the semiconductor chip so that the first surface of the conductive plate faces the primary surface of the semiconductor chip, the current passing electrode and the control electrodes facing the corresponding projecting portions;

etching the conductive plate fixed on the semiconductor chip from the second surface of the conductive plate so that the projecting portions are separated from each other; and connecting a conductive wire to each of the separated projecting portions.

2. The method of manufacturing a semiconductor device of claim 1, further comprising etching a surface of a flat plate to form the conductive plate with the projecting portions.

3. The method of manufacturing a semiconductor device of claim 2, wherein the etching of the flat plate is performed so that the alignment of the projecting portions corresponds to the alignment of the current passing electrodes and the control electrodes.

4. The method of manufacturing a semiconductor device of claims 1, 2 or 3, wherein the fixing of the conductive plate on the semiconductor chip comprises applying a solder between the projecting portions and the corresponding current passing and control electrodes.

5. The method of manufacturing a semiconductor device of claim 1, wherein the conductive plate comprises a copper plate.

6. The method of manufacturing a semiconductor device of claim 1, wherein the conductive wires are made of copper, and the conductive wires are connected to the separated conductive plates using a solder.

7. The method of manufacturing a semiconductor device of claim 6, further comprising plating a portion of each of the conductive wires or a portion of each of the conductive plates before the connecting of the conductive wire to the corresponding separated projecting portions.

8. The method of manufacturing a semiconductor device of claim 7, wherein the plating is carried out using gold, silver, palladium or a solder.

9. The method of manufacturing a semiconductor device of claim 1, wherein the conductive wires are made of gold or aluminum, and the conductive wires are connected to the separated conductive plates by wire bonding.

10. The method of manufacturing a semiconductor device of claims 1, 6 or 9, further comprising providing a first connection region and a second connection region, and connecting the free end of each of the conductive wires to the corresponding connection region so that the conductive wires corresponding to the current passing electrodes are connected to the first connection region and the conductive wires corresponding to the control electrodes are connected to the second connection region.

* * * * *